(12) United States Patent
Miller et al.

(10) Patent No.: US 8,185,230 B2
(45) Date of Patent: May 22, 2012

(54) METHOD AND APPARATUS FOR PREDICTING DEVICE ELECTRICAL PARAMETERS DURING FABRICATION

(75) Inventors: Michael L. Miller, Cedar Park, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 2780 days.

(21) Appl. No.: 10/225,638

(22) Filed: Aug. 22, 2002

(65) Prior Publication Data

US 2004/0040001 A1 Feb. 26, 2004

(51) Int. Cl.
*G06F 17/50* (2006.01)
*G06F 19/00* (2011.01)

(52) U.S. Cl. .......................... 700/121; 716/100; 716/136
(58) Field of Classification Search .............. 716/4, 100, 716/136; 703/22; 700/121
See application file for complete search history.

(56) References Cited

U.S. PATENT DOCUMENTS

| | | | | |
|---|---|---|---|---|
| 4,796,194 | A | | 1/1989 | Atherton ........................ 364/468 |
| 6,154,711 | A | | 11/2000 | Steffan et al. ..................... 702/82 |
| 6,161,054 | A | * | 12/2000 | Rosenthal et al. ............. 700/121 |
| 6,368,884 | B1 | * | 4/2002 | Goodwin et al. ................ 438/14 |
| 6,405,144 | B1 | | 6/2002 | Ackmann et al. ................ 702/84 |
| 6,470,230 | B1 | * | 10/2002 | Toprac et al. .................. 700/121 |
| 6,587,744 | B1 | * | 7/2003 | Stoddard et al. .............. 700/121 |
| 6,587,774 | B2 | * | 7/2003 | Hessmert et al. ............... 701/83 |
| 6,622,059 | B1 | * | 9/2003 | Toprac et al. .................. 700/121 |
| 6,738,682 | B1 | * | 5/2004 | Pasadyn ........................ 700/100 |
| 6,745,086 | B1 | * | 6/2004 | Pasadyn et al. ................. 700/28 |
| 6,754,593 | B1 | * | 6/2004 | Stewart et al. .................. 702/35 |
| 2002/0193899 | A1 | * | 12/2002 | Shanmugasundram et al. ............................. 700/108 |
| 2003/0101013 | A1 | * | 5/2003 | Solecky et al. ................. 702/85 |
| 2003/0180972 | A1 | * | 9/2003 | Al-Bayati et al. .............. 438/14 |
| 2003/0216827 | A1 | * | 11/2003 | Mouli ............................. 700/97 |
| 2003/0229410 | A1 | * | 12/2003 | Smith et al. ................... 700/109 |
| 2003/0229412 | A1 | * | 12/2003 | White et al. .................. 700/121 |

FOREIGN PATENT DOCUMENTS

| WO | WO 01/50522 A | 7/2001 |
|---|---|---|
| WO | WO 01/80306 A | 10/2001 |

OTHER PUBLICATIONS

International Search Report (PCT/US/03/21287) dated Jan. 15, 2004.

* cited by examiner

*Primary Examiner* — Stacy Whitmore
(74) *Attorney, Agent, or Firm* — Williams, Morgan & Amerson

(57) ABSTRACT

A method includes providing a set of initial characteristic values associated with the semiconductor device. A first fabrication process is performed on the semiconductor device. Fabrication data associated with the first fabrication process is collected. At least one of the initial characteristic values is replaced with the fabrication data collected for the first fabrication process to generate a first modified set of characteristic values. A first value for at least one electrical characteristic of the semiconductor device is predicted based on the modified set of characteristic values. A system includes a first process tool, a first data collection unit, and a prediction unit. The first process tool is configured to perform a first fabrication process on the semiconductor device. The first data collection unit is configured to collect fabrication data associated with the first fabrication process. The prediction unit is configured to provide a set of initial characteristic values associated with the semiconductor device, replace at least one of the initial characteristic values with the fabrication data collected for the first fabrication process to generate a first modified set of characteristic values, and predict a first value for at least one electrical characteristic of the semiconductor device based on the modified set of characteristic values.

36 Claims, 3 Drawing Sheets

METHOD AND APPARATUS FOR PREDICTING DEVICE ELECTRICAL PARAMETERS DURING FABRICATION

BACKGROUND OF THE INVENTION

1. Field of the Invention

This invention relates generally to the field of semiconductor device manufacturing and, more particularly, to a method and apparatus for predicting device electrical parameters during fabrication.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. One technique for improving the operation of a semiconductor processing line includes using a factory wide control system to automatically control the operation of the various processing tools. The manufacturing tools communicate with a manufacturing framework or a network of processing modules. Each manufacturing tool is generally connected to an equipment interface. The equipment interface is connected to a machine interface which facilitates communications between the manufacturing tool and the manufacturing framework. The machine interface can generally be part of an advanced process control (APC) system. The APC system initiates a control script based upon a manufacturing model, which can be a software program that automatically retrieves the data needed to execute a manufacturing process. Often, semiconductor devices are staged through multiple manufacturing tools for multiple processes, generating data relating to the quality of the processed semiconductor devices. Pre-processing and/or post-processing metrology data is supplied to process controllers for the tools. Operating recipe parameters are calculated by the process controllers based on the performance model and the metrology information to attempt to achieve post-processing results as close to a target value as possible. Reducing variation in this manner leads to increased throughput, reduced cost, higher device performance, etc., all of which equate to increased profitability.

In a typical semiconductor fabrication facility, wafers are processed in groups, referred to as lots. The wafers in a particular lot generally experience the same processing environment. In some tools, all of the wafers in a lot are processed simultaneously, while in other tools the wafers are processed individually, but under similar conditions (e.g., using the same operating recipe). Typically, a lot of wafers is assigned a priority in the beginning of its processing cycle. Priority may be assigned on the basis of the number of wafers in the lot or its status as a test or experimental lot, for example.

At a particular processing step, the relative assigned priorities of all the lots ready for processing are compared. Various rules are applied to determine which of the eligible lots is selected for processing. For example, for two lots with the same priority, the older of the lots is often selected for subsequent processing. In the case of a test lot of wafers (i.e., generally including a reduced number of wafers), the lot is subjected to one or more experimental processing steps or recipe adjustments in an attempt to improve the performance of the process or the performance of the resultant devices. Before commencing production of regular production lots using the experimental parameters, it is useful to first test the effectiveness of the changes based on the resulting characteristics of the wafers in the test lot. Hence, a test lot would be assigned a relatively high priority over other production lots, such that its processing is completed more quickly. Regardless of the particular priority assignments made, the rules are essentially static and predetermined. The priority of a particular lot does not typically change during its processing cycle, unless its status changes from being a production lot to a test lot, for example.

During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. Devices are typically ranked by a grade measurement, which effectively determines its market value. In general, the higher a device is graded, the more valuable the device.

Because of the large number of variables affecting a device's performance characteristics, it is difficult to predict the grade of the device prior to the performing of electrical tests on the devices. Wafer electrical test (WET) measurements are typically not performed on processed wafers until quite late in the fabrication process, sometimes not until weeks after the processing has been completed. When one or more of the processing steps produce resulting wafers that the WET measurements indicate are unacceptable, the resulting wafers may need to be scrapped. However, in the meantime, the misprocessing might have gone undetected and uncorrected for a significant time period, leading to many scrapped wafers, much wasted material, and decreased overall throughput.

The present invention is directed to overcoming, or at least reducing the effects of, one or more of the problems set forth above.

SUMMARY OF THE INVENTION

One aspect of the present invention is seen in a method that includes providing a set of initial characteristic values associated with the semiconductor device. A first fabrication process is performed on the semiconductor device. Fabrication data associated with the first fabrication process is collected. At least one of the initial characteristic values is replaced with the fabrication data collected for the first fabrication process to generate a first modified set of characteristic values. A first value for at least one electrical characteristic of the semiconductor device is predicted based on the modified set of characteristic values.

Another aspect of the present invention is seen in a system including a first process tool, a first data collection unit, and a prediction unit. The first process tool is configured to perform a first fabrication process on the semiconductor device. The first data collection unit is configured to collect fabrication data associated with the first fabrication process. The prediction unit is configured to provide a set of initial characteristic values associated with the semiconductor device, replace at least one of the initial characteristic values with the fabrication data collected for the first fabrication process to generate a first modified set of characteristic values, and predict a first value for at least one electrical characteristic of the semiconductor device based on the modified set of characteristic values.

BRIEF DESCRIPTION OF THE DRAWINGS

The invention may be understood by reference to the following description taken in conjunction with the accompanying drawings, in which like reference numerals identify like elements, and in which.

Figure 1:
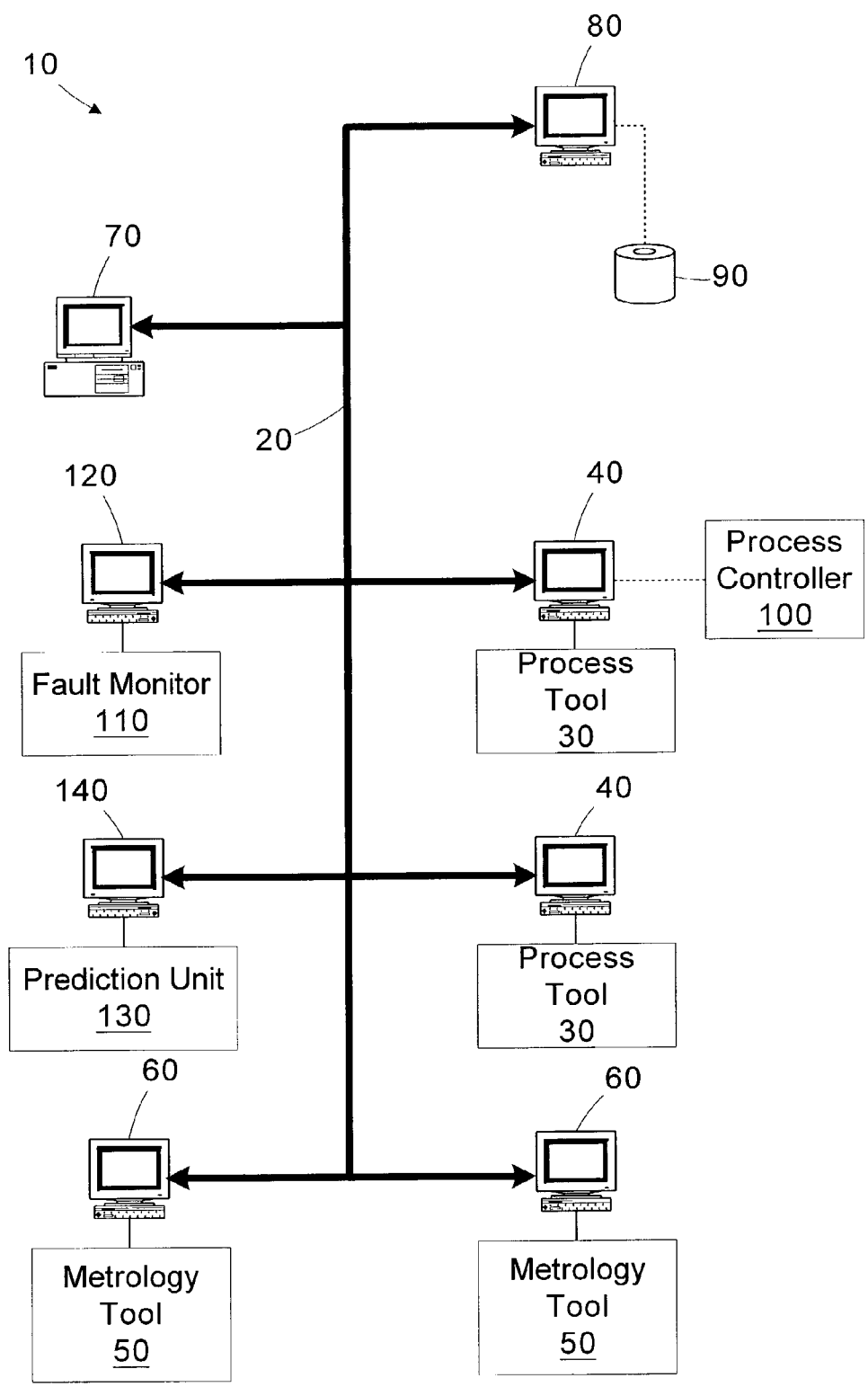
FIG. 1 is a simplified block diagram of a manufacturing system in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, a simplified block diagram of an illustrative manufacturing system 10 is provided. In the illustrated embodiment, the manufacturing system 10 is adapted to process semiconductor wafers, however, the invention is not so limited and may be applied to other types of manufacturing environments and other types of workpieces. A network 20 interconnects various components of the manufacturing system, allowing them to exchange information. The illustrative manufacturing system 10 includes a plurality of process tools 30, each being coupled to a computer 40 for interfacing with the network 20. The manufacturing system 10 also includes one or more metrology tools 50 coupled to computers 60 for interfacing with the network 20. The metrology tools 50 may be used to measure output characteristics of the wafers processed in the process tool 30 to generate metrology data. Although the tools 30, 50 are illustrated as interfacing with the network 20 through the computers 40, 60, the tools 30, 50 may include integrated circuitry for interfacing with the network 20, eliminating the need for the computers 40, 60. A manufacturing execution system (MES) server 70 directs the high level operation of the manufacturing system 10 by directing the process flow of the manufacturing system 10. The MES server 70 monitors the status of the various entities in the manufacturing system, including the tools 30, 50. The process tools 30 may be process tools, such as photolithography steppers, etch tools, deposition tools, polishing tools, rapid thermal process tools, implantation tools, etc. The metrology tools 50 may be measurement tools, such as optical measurement tools, electrical measurement tools, scanning electron microscopes, gas analyzers, etc.

A database server 80 is provided for storing data related to the status of the various entities and workpieces (e.g., wafers) in the process flow. The database server 80 may store information in one or more data stores 90. The metrology data may include feature measurements, process layer thicknesses, electrical performance characteristics, defect measurements, surface profiles, etc. Maintenance history for the tools 30 (e.g., cleaning, consumable item replacement, repair) may also be stored in the data store 90 by the MES server 70 or by a tool operator.

Some of the process tools 30 include process controllers 100 that are adapted to automatically control the operating recipes of their respective tools 30. A particular process tool 30 may have more than one process controller 100 adapted to control more than one operating recipe parameter based on feedback and/or feedforward metrology data collected. If the tool 30 is a CMP tool, the process controller 100 may receive pre-polish thickness measurements (e.g., thickness of high features, thickness of low features) and predict a polishing time or pressure required to achieve a post-polish target thickness. In the case where the process tool 30 is an etch tool, the process controller 100 may model the etching performance of the process tool 30 based on pre-etch and/or post-etch thickness measurements. The process controller 100 may use a control model of the process tool 30 to generate its prediction. The control model may be developed empirically using commonly known linear or non-linear techniques. The control model may be a relatively simple equation based model (e.g., linear, exponential, weighted average, etc.) or a more complex model, such as a neural network model, principal component analysis (PCA) model, or a projection to latent structures (PLS) model. The specific implementation of the model may vary depending on the modeling technique selected. Using the control model, the process controller 100 may determine operating recipe parameters to reduce post-processing variations. The particular control scenario depends on the particular type of process tool 30 being controlled.

The manufacturing system 10 may also include a fault monitor 110 executing on a computer 120 for monitoring the devices fabricated in the manufacturing system 10. The fault monitor 110 may use data collected by the metrology tools 50 that indicate unacceptable conditions. The fault monitor 110 may use various techniques, such as statistical process control (SPC) techniques to identify faults. Faulty wafers may be reworked or scrapped. Techniques for identifying and addressing faults are known to those of ordinary skill in the art, and for clarity and to avoid obscuring the present invention, they are not described in greater detail herein.

The manufacturing system 10 includes a prediction unit 130 executing on a computer 140 for predicting electrical characteristics of devices fabricated by the manufacturing system 10 based on data collected during the fabrication process. As described in greater detail below, the prediction unit 130 employs a modeling technique that incorporates data, such as metrology data from one of the metrology tools 50, process data from one of the process tools 30, and/or control data from one of the process controllers 100, into a set of previously determined design values and calculates predicted values for various electrical characteristics of the completed device. For example, when a device first begins the fabrication process, the prediction unit 130 begins with default values for the characteristics of the device (e.g., line width, spacer width, contact size, layer thicknesses, implant dose, implant energy, etc.). The default values may be based on the design characteristics of the device. As the device progresses through the fabrication process, data is collected that indicates the actual values of these characteristics. The collected data is substituted for the initial data, and the prediction unit 130 updates its prediction of the electrical characteristics of the completed device. As the quantity of the collected data increases, the accuracy of the predicted values also improves. The prediction unit 130 is thus able to predict the electrical characteristics of the devices throughout the fabrication cycle. The predicted electrical characteristics may be useful for influencing process settings, enhancing fault detection, and guiding scheduling decisions, as is discussed in greater detail below.

The distribution of the processing and data storage functions amongst the different computers 40, 60, 70, 80, 120, 140 is generally conducted to provide independence and a central information store. Of course, different numbers of computers and different arrangements may be used.

An exemplary information exchange and process control framework suitable for use in the manufacturing system 10 is an Advanced Process Control (APC) framework, such as may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Figure 2:
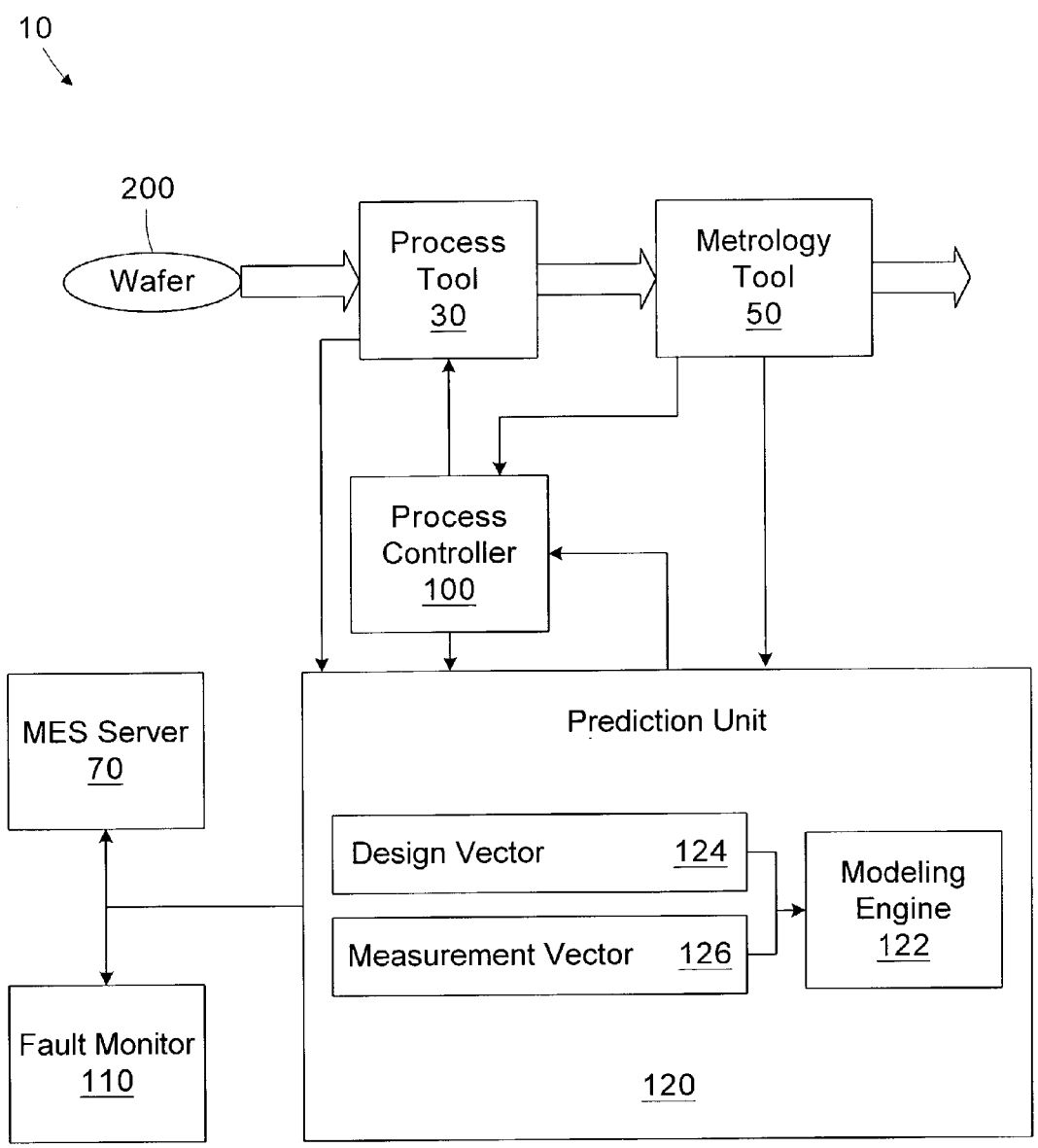
FIG. 2 is a simplified block diagram of a portion of the manufacturing system of FIG. 1.

Referring now to FIG. 2, a simplified block diagram of a portion of the manufacturing system of FIG. 1 is provided. The process tool 30 processes wafers 200 according to an operating recipe. The process tool 30 may also be a single chamber of a multiple chamber tool 30. The metrology tool 50 measures output characteristics of the wafers processed in the process tool 30 to gauge the efficacy of the process implemented by the process tool 30. The metrology data collected by the metrology tool 50 may be passed to the process controller 100 for dynamically updating the operating recipe of the process tool 30 to reduce variation between the measured output characteristic and a target value for the characteristic.

The output characteristics measured by the metrology tool 50 may also be passed to the prediction unit 130 for use in updating its predictions for the electrical characteristics of the devices on the wafer 200. Although only one process tool 30 and metrology tool 50 are shown, in an actual fabrication facility, many process tools and metrology tools are employed. The prediction unit 130 receives metrology data from the various metrology tools as the wafer 200 progresses.

The prediction unit 130 may also receive data from the process tool 30, or from sensors (not shown) associated with the process tool 30, regarding the processing environment experienced by the wafer 200 during the fabrication process. Exemplary process data include chamber pressure, chamber temperature, anneal time, implant dose, implant energy, plasma energy, processing time, etc. The prediction unit 130 may also receive data from the process controller 100 concerning the operating recipe settings used during the fabrication process. For example, it may not be possible to measure direct values for some process parameters. The process controller 100 may provide the settings for these parameters in lieu of actual process data from the process tool 30. Other process control data may include the values of various state conditions estimated and/or controlled by the process controller 100.

The metrology tool 50, the process tool 30, and the process controller 100 may be referred to as data collection units collecting data associated with the fabrication of the semiconductor devices on the wafer 200 during its fabrication.

As seen in FIG. 2, the prediction unit 130 employs a modeling engine 122 that predicts electrical characteristics of a virtual device defined by values specified in a design vector 124 and a fabrication vector 126. The design vector 124 represents the initial default characteristics predetermined for the devices (i.e., the target values for the production process). Exemplary parameters included in the design vector 124 are N-channel threshold voltage adjust implant (NVT) dose, NVT energy, gate oxide thickness, N-channel lightly-doped drain implant (NLDD) dose, NLDD energy 44, channel length, spacer width, polysilicon gate linewidth, etc. These parameters describe the experimental construct of a transistor and are established based upon previous engineering knowledge. Additional or different parameters may be utilized to describe different experimental constructs.

The fabrication vector 126 includes the characteristics associated with the devices on the wafer 200 that are collected during the fabrication process (e.g., metrology data, process data, or control data). In one embodiment, the modeling engine 122 merges the design vector 124 and the fabrication vector 126 each time it predicts the electrical characteristics. In another embodiment, the fabrication vector 126 is initially loaded with the values in the design vector 124. As characteristic data is collected, the design values in the fabrication vector 126 are replaced by the measurement data.

Various technology computer-aided design (TCAD) tools are commercially available for performing the functions of the modeling engine 122. The particular modeling tool selected depends on the type of semiconductor device being fabricated and the type of electrical characteristics for which predictions are desired. Exemplary software tools are Tsuprem-4 and Medici offered by Synopsis, Inc. of Mountain View, Calif. Exemplary electrical characteristics that may be predicted by the prediction unit 130 are drive current, ring oscillator frequency, memory cell erase times, contact resistance, effective channel length, etc.

There are various uses for the predicted electrical characteristics. For example, the prediction unit 130 may provide its predictions to the fault monitor 115 for fault detection purposes. If the predicted electrical characteristics are outside a predetermined range, a problem with the wafers 200 or the process tools 30 used to fabricate the wafers 200 may be present. The fault monitor 115 may initiate an automatic corrective action based on the predicted electrical characteristics. Exemplary corrective actions include sending an alert message to fabrication personnel to suggest troubleshooting the problem, automatically halting subsequent processing, marking the wafers as suspect, etc.

Another use for the predicted electrical characteristics is process control. The prediction unit 130 may pass the predicted electrical characteristics to one or more process controllers 100 for updating the operating recipes of their controlled tools 30. For example, if the predicted contact resistance of a device is too high, the process controller 100 may adjust a metal plating parameter to reduce the contact resistance for subsequent wafers 200. The process controller 100 may also adjust parameters such as implant dose and energy to affect the electrical performance of subsequent transistor devices.

The predicted electrical characteristics may also be used for scheduling purposes. For example, the MES server 70 may adjust the priority of the lot including the wafer 200 if the predicted electrical characteristics indicate a high-performing device or a device having predicted electrical characteristics consistent with a business need for devices of a certain grade. Also, the MES server 70 may make scheduling decisions based on the predicted electrical characteristics. For example, the MES server 70 may schedule lots with higher predicted electrical characteristics to be processed by tools 30 with higher tool health (e.g., clean tool, low defect rate, low overlay error, etc.).

The predicted electrical characteristics may be used to generate feedback for updating the prediction model employed by the modeling engine 122. When the actual characteristics of the semiconductor device are measured, they can be compared with the predicted values to generate an error signal. This error signal may be used by the modeling engine 122 to adjust its model parameters to reduce the magnitude of the error for future predictions.

Figure 3:
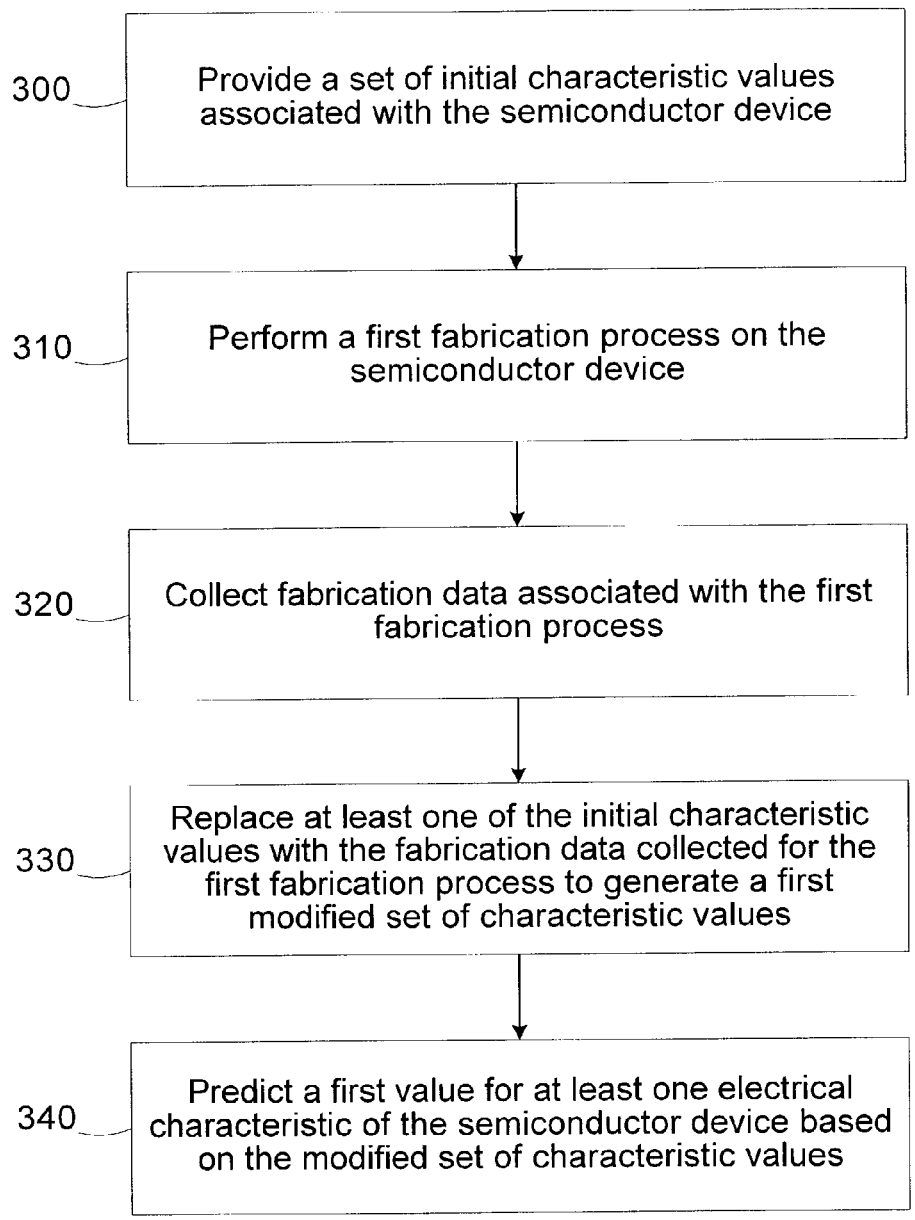
FIG. 3 is a simplified flow diagram of a method for predicting device electrical parameters during fabrication in accordance with another illustrative embodiment of the present invention.

Turning now to FIG. 3, a simplified flow diagram of a method for predicting device electrical parameters during fabrication in accordance with another illustrative embodiment of the present invention is provided. In block 300, a set of initial characteristic values associated with the semiconductor device is provided. In block 310, a first fabrication process on the semiconductor device is performed. In block 320, fabrication data associated with the first fabrication process is collected. In block 330, at least one of the initial characteristic values is replaced with the fabrication data collected for the first fabrication process to generate a first modified set of characteristic values. In block 340, a first value for at least one electrical characteristic of the semiconductor device is predicted based on the modified set of characteristic values.

Predicting the electrical characteristics of the semiconductor device during the fabrication process has numerous advantages. Insight may be gained regarding the manufacturing processes as well as the future performance of the semiconductor device. Conventionally, this information is only available late in the fabrication process. Generating the predictions during the fabrication process allows process settings to be adjusted, fault conditions to be identified, and scheduling decisions to be made based on the anticipated performance of the devices being fabricated.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a set of initial characteristic values associated with a semiconductor device;
performing a first fabrication process on the semiconductor device;
collecting fabrication data associated with the first fabrication process;
replacing at least one of the initial characteristic values with the fabrication data collected for the first fabrication process to generate a first modified set of characteristic values; and
predicting a first value for at least one electrical characteristic of the semiconductor device based on the first modified set of characteristic values.

2. The method of claim 1, further comprising:
performing a second fabrication process on the semiconductor device;
collecting fabrication data associated with the second fabrication process;
replacing at least one of the initial characteristic values with the fabrication data collected for the second fabrication process to generate a second modified set of characteristic values; and
predicting a second value for the at least one electrical characteristic of the semiconductor device based on the second modified set of characteristic values.

3. The method of claim 1, further comprising identifying a fault condition associated with the semiconductor device based on the first value of the electrical characteristic.

4. The method of claim 1, further comprising scheduling the semiconductor device for subsequent processing based on the first value of the electrical characteristic.

5. The method of claim 1, further comprising determining at least one operating recipe parameter for processing a subsequent semiconductor device based on the first value of the electrical characteristic.

6. The method of claim 1, wherein predicting the first value for the electrical characteristic of the semiconductor device further comprises predicting at least one of a drive current, a ring oscillator frequency, a memory cell erase time, a contact resistance, and an effective channel length.

7. The method of claim 1, wherein collecting fabrication data associated with the first fabrication process further comprises collecting a process characteristic associated with the first fabrication process.

8. The method of claim 1, wherein collecting fabrication data associated with the first fabrication process further comprises collecting a metrology characteristic of the semiconductor device.

9. The method of claim 1, wherein collecting fabrication data associated with the first fabrication process further comprises collecting a control characteristic associated with a process controller configured to control the first fabrication process.

10. A method, comprising:
storing characteristics associated with the processing of a semiconductor device collected during its fabrication;
providing a vector of initial characteristic values associated with the semiconductor device;
updating the vector with the collected characteristics; and
modeling at least one electrical characteristic of the semiconductor device based on the updated vector.

11. The method of claim 10, further comprising identifying a fault condition associated with the semiconductor device based on the modeled electrical characteristic.

12. The method of claim 10, further comprising scheduling the semiconductor device for subsequent processing based on the modeled electrical characteristic.

13. The method of claim 10, further comprising determining at least one operating recipe parameter for processing a subsequent semiconductor device based on the modeled electrical characteristic.

14. The method of claim 10, further comprising iterating the modeling of the electrical characteristic as new characteristics are stored.

15. The method of claim 10, wherein storing characteristics associated with the processing of the semiconductor device further comprises storing a process characteristic associated with the fabrication of the semiconductor device.

16. The method of claim 10, wherein storing characteristics associated with the processing of the semiconductor device further comprises storing a metrology characteristic associated with the semiconductor device.

17. The method of claim 10, wherein storing characteristics associated with the processing of the semiconductor device further comprises storing a control characteristic associated with a process controller configured to control the fabrication.

18. A system, comprising:
a first process tool configured to perform a first fabrication process on the semiconductor device;
a first data collection unit configured to collect fabrication data associated with the first fabrication process;
a prediction unit configured to provide a set of initial characteristic values associated with the semiconductor device, replace at least one of the initial characteristic values with the fabrication data collected for the first fabrication process to generate a first modified set of characteristic values, and predict a first value for at least one electrical characteristic of the semiconductor device based on the modified set of characteristic values.

19. The system of claim 18, further comprising:
a second process tool configured to perform a second fabrication process on the semiconductor device; and
a second data collection unit configured to collect fabrication data associated with the second fabrication process;
wherein the prediction unit is further configured to replace at least one of the initial characteristic values with the fabrication data collected for the second fabrication process to generate a second modified set of characteristic values and predict a second value for the at least one electrical characteristic of the semiconductor device based on the second modified set of characteristic values.

20. The system of claim 18, further comprising a fault monitor communicatively coupled to the prediction unit to receive the first value of the electrical characteristic from the prediction unit and identify a fault condition associated with the semiconductor device based on the first value of the electrical characteristic.

21. The system of claim 18, further comprising a manufacturing execution system server communicatively coupled to the prediction unit to receive the first value of the electrical characteristic from the prediction unit and schedule the semiconductor device for subsequent processing based on the first value of the electrical characteristic.

22. The system of claim 18, further comprising a process controller communicatively coupled to the prediction unit to receive the first value of the electrical characteristic from the prediction unit and determine at least one operating recipe parameter for processing a subsequent semiconductor device based on the first value of the electrical characteristic.

23. The system of claim 18, wherein the prediction unit is configured to predict at least one of a drive current, a ring oscillator frequency, a memory cell erase time, a contact resistance, and an effective channel length.

24. The system of claim 18, wherein the fabrication data associated with the first fabrication process further comprises a process characteristic associated with the first fabrication process.

25. The system of claim 18, wherein the fabrication data associated with the first fabrication process further comprises a metrology characteristic of the semiconductor device.

26. The system of claim 18, wherein the fabrication data associated with the first fabrication process further comprises a control characteristic associated with a process controller configured to control the first fabrication process.

27. A system, comprising:
a data store configured to store characteristics of a semiconductor device collected during its fabrication; and
a prediction unit configured to provide a vector of initial characteristic values associated with the semiconductor device, update the vector with the collected characteristics, and model at least one electrical characteristic of the semiconductor device based on the updated vector.

28. The system of claim 27, further comprising a fault monitor communicatively coupled to the prediction unit and configured to identify a fault condition associated with the semiconductor device based on the modeled electrical characteristic.

29. The system of claim 27, further comprising a manufacturing execution system server communicatively coupled to the prediction unit and configured to schedule the semiconductor device for subsequent processing based on the modeled electrical characteristic.

30. The system of claim 27, further comprising a process controller communicatively coupled to the prediction unit and configured to determine at least one operating recipe parameter for processing a subsequent semiconductor device based on the modeled electrical characteristic.

31. The system of claim 27, wherein the prediction unit is further configured to iterate the modeling of the electrical characteristic as new characteristics are collected and stored.

32. The system of claim 27, wherein the collected characteristics further comprise process characteristics associated with the first fabrication process.

33. The system of claim 27, wherein collected characteristics further comprise metrology characteristics of the semiconductor device.

34. The system of claim 27, wherein collected characteristics further comprise control characteristics.

35. A system, comprising:
- means for providing a set of initial characteristic values associated with the semiconductor device;
- means for performing a first fabrication process on the semiconductor device;
- means for collecting fabrication data associated with the first fabrication process;
- means for replacing at least one of the initial characteristic values with the fabrication data collected for the first fabrication process to generate a first modified set of characteristic values; and
- means for predicting a first value for at least one electrical characteristic of the semiconductor device based on the first modified set of characteristic values.

36. A system, comprising:
- means for storing characteristics associated with the processing of a semiconductor device collected during its fabrication;
- means for providing a vector of initial characteristic values associated with the semiconductor device;
- means for updating the vector with the collected characteristics; and
- means for modeling at least one electrical characteristic of the semiconductor device based on the updated vector.

* * * * *